United States Patent
You et al.

(10) Patent No.: US 10,483,840 B2
(45) Date of Patent: Nov. 19, 2019

(54) POWER CONVERSION APPARATUS

(71) Applicant: Delta Electronics (Shanghai) Co., Ltd., Shanghai (CN)

(72) Inventors: Peiai You, Shanghai (CN); Hao Sun, Shanghai (CN); Jinfa Zhang, Shanghai (CN)

(73) Assignee: DELTA ELECTRONICS (SHANGHAI) CO., LTD., Shanghai (CN)

( * ) Notice: Subject to any disclaimer, the term of this patent is extended or adjusted under 35 U.S.C. 154(b) by 0 days.

(21) Appl. No.: 16/239,554

(22) Filed: Jan. 4, 2019

(65) Prior Publication Data
US 2019/0245430 A1  Aug. 8, 2019

(30) Foreign Application Priority Data
Feb. 6, 2018  (CN) .......................... 2018 1 0118950

(51) Int. Cl.
*H02M 1/32* (2007.01)
*H05K 7/20* (2006.01)

(52) U.S. Cl.
CPC .......... *H02M 1/32* (2013.01); *H05K 7/20272* (2013.01); *H05K 7/20327* (2013.01); *H05K 7/20381* (2013.01); *H02M 2001/327* (2013.01)

(58) Field of Classification Search
CPC .............. H02M 1/32; H02M 2001/327; H05K 7/20381; H05K 7/20272; H05K 7/20327; H05K 7/20872; H05K 7/20927; H05K 7/2089; G06F 2200/201; G06F 1/20; H01L 23/473

USPC .......... 361/677, 679.53, 688, 699, 704, 707, 361/713–715, 721
See application file for complete search history.

(56) References Cited

U.S. PATENT DOCUMENTS

| | | | |
|---|---|---|---|
| 5,520,976 A * | 5/1996 | Giannetti ............. | H05K 7/1418 174/384 |
| 6,892,796 B1 * | 5/2005 | Nagashima ......... | H01L 23/4093 165/80.4 |
| 2003/0133257 A1 * | 7/2003 | Beihoff ................. | B60L 15/007 361/600 |

(Continued)

FOREIGN PATENT DOCUMENTS

CN  106561076 A  4/2017

*Primary Examiner* — Jayprakash N Gandhi
*Assistant Examiner* — Stephen S Sul
(74) *Attorney, Agent, or Firm* — CKC & Partners Co., LLC

(57) ABSTRACT

A power conversion apparatus is provided, which comprises a housing, a mother board, an electromagnetic filter board, a signal board, and a heat-dissipation module. The housing includes a first heat-dissipation wall and a coolant passage. The mother board is disposed upon the housing, and comprises a first surface facing the housing and a first power device. The heat-dissipation module includes a first insulated heat-conducting sheet adhered to the corresponding first heat-dissipation wall and a first elastic clamp. When the first surface of the mother board approaches the housing to clamp the first power device within the accommodating space, the first power device is pressed against by the first elastic clamp and thus adhered to the first insulated heat-conducting sheet, so that the first power device is thermally coupled to the first heat-dissipation wall and the coolant passage via the first insulated heat-conducting sheet.

21 Claims, 8 Drawing Sheets

(56) References Cited

U.S. PATENT DOCUMENTS

| | | | | |
|---|---|---|---|---|
| 2003/0133319 | A1* | 7/2003 | Radosevich | B60L 15/007 |
| | | | | 363/141 |
| 2011/0249421 | A1* | 10/2011 | Matsuo | B60K 6/445 |
| | | | | 361/821 |
| 2013/0223011 | A1* | 8/2013 | You | H05K 7/20927 |
| | | | | 361/702 |
| 2013/0235527 | A1* | 9/2013 | Wagner | H05K 1/0203 |
| | | | | 361/702 |
| 2014/0126154 | A1* | 5/2014 | Higuchi | B60L 15/20 |
| | | | | 361/714 |
| 2014/0313806 | A1* | 10/2014 | Shinohara | H05K 7/20927 |
| | | | | 363/141 |
| 2014/0355212 | A1* | 12/2014 | Campbell | H05K 7/20236 |
| | | | | 361/699 |
| 2015/0145469 | A1* | 5/2015 | You | H02J 7/0042 |
| | | | | 320/107 |
| 2015/0146378 | A1* | 5/2015 | You | H05K 7/20254 |
| | | | | 361/707 |
| 2015/0303164 | A1* | 10/2015 | Chen | H01L 24/32 |
| | | | | 361/720 |
| 2016/0242308 | A1* | 8/2016 | Nakazawa | H02M 3/33576 |
| 2016/0248326 | A1* | 8/2016 | Kadowaki | H02M 1/088 |
| 2017/0040907 | A1* | 2/2017 | Goto | H02M 3/28 |

* cited by examiner

POWER CONVERSION APPARATUS

CROSS-REFERENCE TO RELATED APPLICATIONS

This non-provisional application claims priority under 35 U.S.C. § 119(a) on Patent Application No. 201810118950.2 filed in P.R. China on Feb. 6, 2018, the entire contents of which are hereby incorporated by reference.

Some references, if any, which may include patents, patent applications and various publications, may be cited and discussed in the description of this invention. The citation and/or discussion of such references, if any, is provided merely to clarify the description of the present invention and is not an admission that any such reference is "prior art" to the invention described herein. All references listed, cited and/or discussed in this specification are incorporated herein by reference in their entireties and to the same extent as if each reference was individually incorporated by reference.

TECHNICAL FIELD

The present invention relates to a power supply unit, and particularly to a power conversion apparatus with a high power density.

BACKGROUND ART

An On Board Charge Module (OBCM) refers to a power conversion apparatus mounted in an electric vehicle and charging an on board battery pack through a ground AC grid. During charging, a user can charge the electric vehicle by directly inserting an AC power cable into a socket of the electric vehicle. Such power conversion apparatus at least include a power conversion module, a base housing, and the like. The power conversion module is used to convert an external power supply into an AC or DC power supply for various voltage levels used in the vehicle. When the power conversion module is operating, a large amount of heat is generated. The base housing provides a heat-dissipation design to dissipate the heat generated by the power conversion module, so as to avoid the accumulation of heat affecting the overall performance of the power conversion module. At present, however, the design of the power conversion module and the heat dissipation design correspondingly provided by the base housing are not good, resulting in a large overall volume of the on board charge module and a low power density.

Therefore, one problem in the field that needs to be settled urgently is how to develop a power conversion apparatus to solve the problems in the prior art.

DISCLOSURE OF THE PRESENT INVENTION

It is an object of the present invention to provide a power conversion apparatus. By way of optimization of the layout of various components, it is possible to provide simple and reliable assembly and fixing, while enhancing the heat-dissipation capability of the respective components, reducing the overall volume of the power conversion apparatus and increasing the overall power density of the power conversion apparatus.

It is another object of the present invention to provide a power conversion apparatus. A power element on the mother board is fixed and adhered to the heat-dissipation surface of a housing via a heat-conducting and insulated heat-dissipation module, while the respective components are disposed between the mother board and the housing and accommodated in the accommodating grooves of the housing, the heat-dissipation surface and the accommodating grooves of the housing being thermally coupled to the coolant passage of the housing together, so that the interface thermal resistance is reduced and the assembly structure is simplified, thereby achieving the goal of reducing costs and increasing the reliability and heat-dissipation capability of the power conversion apparatus.

In order to achieve the above-mentioned objects, the present invention provides a power conversion apparatus, including a housing, a mother board, an electromagnetic filter board, a signal board, and a heat-dissipation module. The housing includes at least one first heat-dissipation wall and a coolant passage, wherein the first heat-dissipation wall is thermally coupled to the coolant passage. The mother board is disposed upon the housing, wherein the mother board comprises a first surface and at least one first power device, wherein the first surface faces the housing, while the first power device is disposed on the mother board and includes a first face and a second face. The electromagnetic filter board is disposed upon the housing and electrically connected to the mother board. The signal board is disposed upon the housing and electrically connected to the mother board. The heat-dissipation module includes at least one first insulated heat-conducting sheet and at least one first elastic clamp. The first insulated heat-conducting sheet is adhered to the corresponding first heat-dissipation wall. The first elastic clamp is fixed to the housing and opposite to the first insulated heat-conducting sheet, so that the first elastic clamp and the first insulated heat-conducting sheet form an accommodating space. When the first surface of the mother board approaches the housing and the first power device is clamped and fixed into the accommodating space between the first elastic clamp and the first insulated heat-conducting sheet, the first power device is pressed against by the first elastic clamp at its first face and thus adhered to the first insulated heat-conducting sheet at its second face, so that the first power device is thermally coupled to the first heat-dissipation wall and the coolant passage via the first insulated heat-conducting sheet.

DETAILED DESCRIPTION OF THE EMBODIMENT

Some typical embodiments that embody the features and advantages of the present invention will be described in detail in the following paragraphs. It will be appreciated that the present invention can have various changes in various aspects, none of which deviate from the scope of the present invention, and the descriptions and figures therein are substantially used for illustration and not for limiting the present invention.

Figure 1:
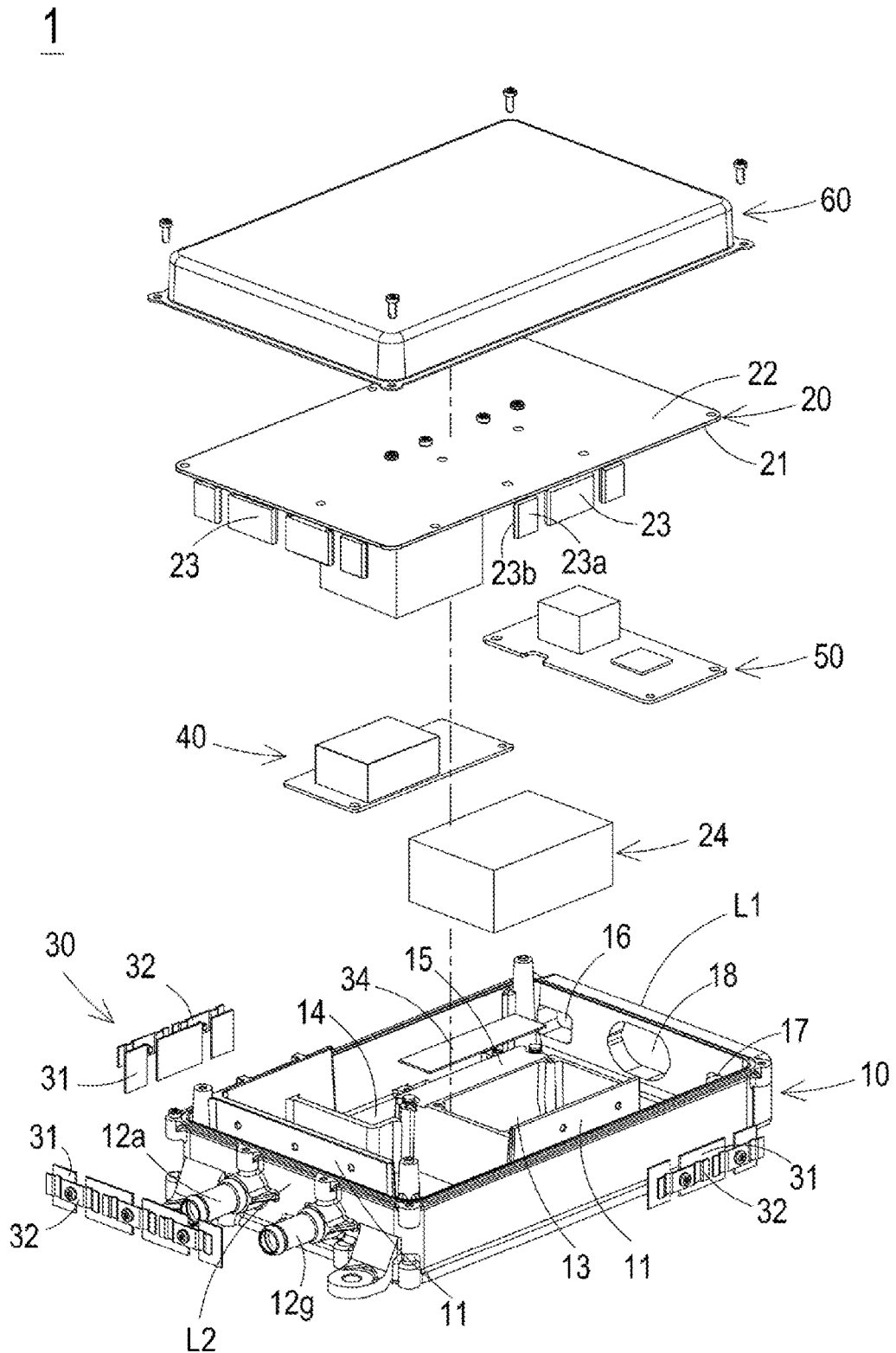
FIG. 1 is an exploded view illustrating the structure of a power conversion apparatus according to a first preferred embodiment of the present invention.
Figure 2:
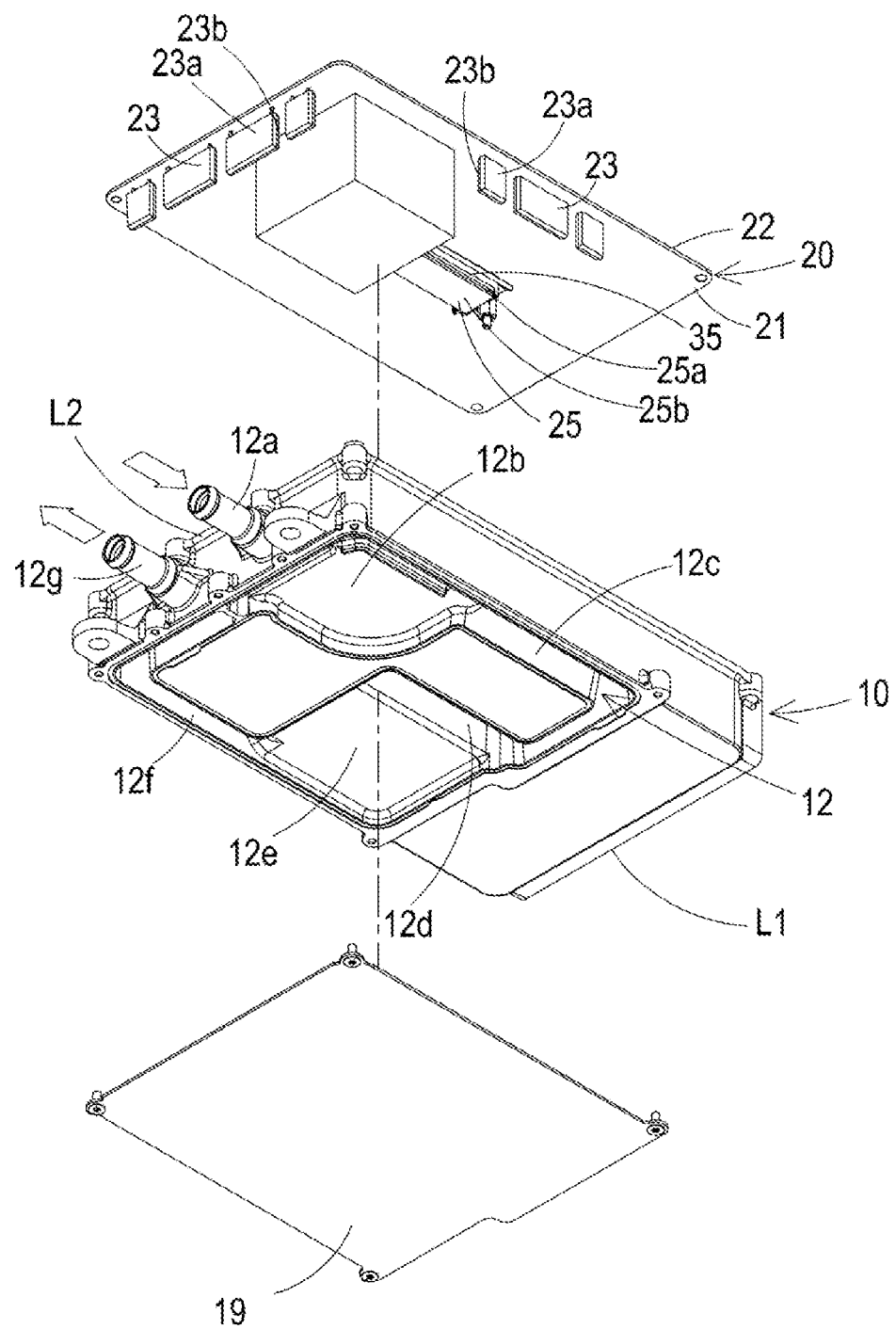
FIG. 2 is an exploded view illustrating a part of the structure of the power conversion apparatus according to the first preferred embodiment of the present invention.
Figure 3:
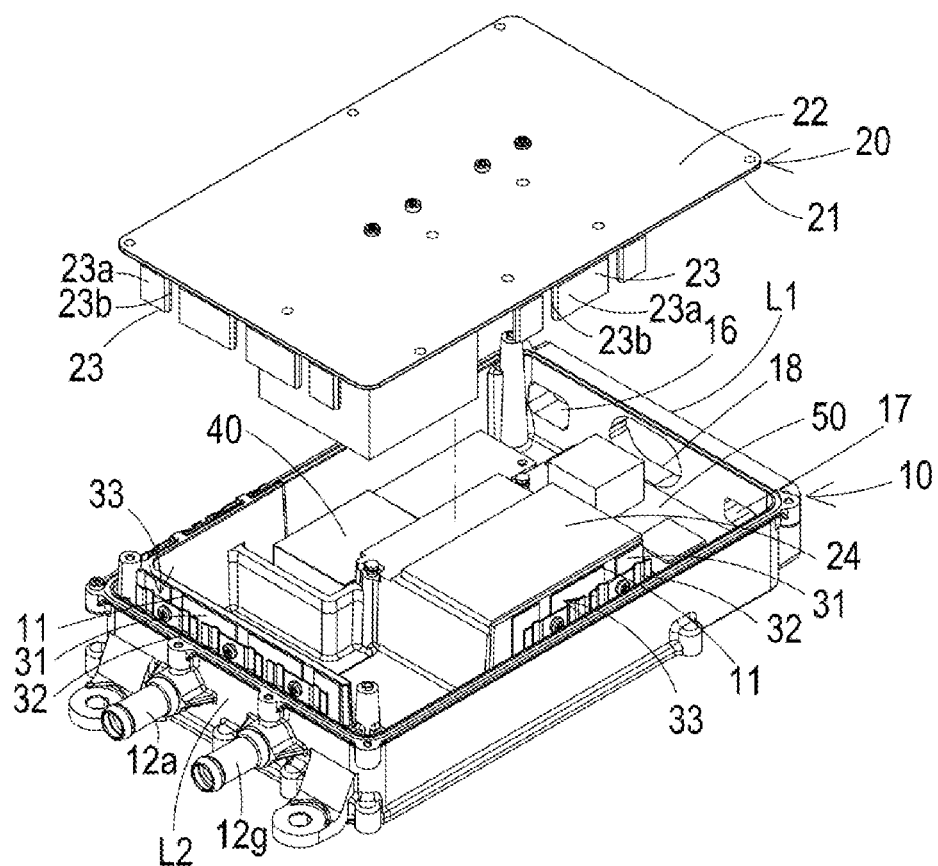
FIG. 3 is an exploded view illustrating a part of the structure of the power conversion apparatus according to the first preferred embodiment of the present invention from another perspective.

FIG. 1 is an exploded view illustrating the structure of a power conversion apparatus according to a first preferred embodiment of the present invention. FIG. 2 is an exploded view illustrating a part of the structure of the power conversion apparatus according to the first preferred embodiment of the present invention. FIG. 3 is an exploded view illustrating a part of the structure of the power conversion apparatus according to the first preferred embodiment of the present invention from another perspective. As shown in FIGS. 1 to 3, the power conversion apparatus 1 of the present invention comprises a housing 10, a mother board 20, an electromagnetic filter board 40, a signal board 50, and a heat-dissipation module 30. The housing 10 includes at least one first heat-dissipation wall 11 and a coolant passage 12, wherein the first heat-dissipation wall 11 is thermally coupled to the coolant passage 12. The mother board 20 is disposed upon the housing 10. The mother board 20 comprises a first surface 21 facings the housing 10, a second surface 22, and at least one first power device 23 disposed on the first surface 21. The first power device 23 comprises a first face 23a and a second face 23b. The electromagnetic filter board 40 is disposed between the first surface 21 of the mother board 20 and the housing 10, and is electrically connected to the mother board 20. The signal board 50 is disposed between the first surface 21 of the mother board 20 and the housing 10, and is electrically connected to the mother board 20.

The heat-dissipation module 30 includes at least one first insulated heat-conducting sheet 31 and at least one first elastic clamp 32. The first insulated heat-conducting sheet 31 can be, for example but not limited to, a Direct-Bond-Copper (DBC) ceramic substrate. The first insulated heat-conducting sheet 31 is adhered to the corresponding first heat-dissipation wall 11, while the first elastic clamp 32 is fixed to the housing 10 and opposite to the first insulated heat-conducting sheet 31, so that the first elastic clamp 32 and the first insulated heat-conducting sheet 31 form an accommodating space 33. When the first surface 21 of the mother board 20 approaches the housing 10 and the first power device 23 is clamped in the accommodating space 33 between the first elastic clamp 32 and the first insulated heat-conducting sheet 31, the first power device 23 is pressed against by the first elastic clamp 32 at its first face 23a and is thus adhered to the first insulated heat-conducting sheet 31 at its second face 23b, so that the first power device 23 is thermally coupled to the first heat-dissipation wall 11 and the coolant passage 12 via the first insulated heat-conducting sheet 31. It should be noted that, the pattern in which the first elastic clamp 32 presses against the first face 23a of the first power device 23 as well as the order of assembling it to the housing 10, or the number of the first power device(s) 23 corresponding to each of the first elastic clamps 32, or the like is adjustable according to actual needs, which are not the essential features that limit the technical solution of the present invention. Any elastic clamp that can form accommodating space 33 with respect to the first heat-dissipation wall 11 and maintain the elastic force is suitable for the present invention that is not limited to this embodiment.

In addition, it should be noted that, in other embodiments, the first power device 23 may be disposed on the second surface 22 of the mother board 20, while the mother board 20, the electromagnetic filter board 40, and the signal board 50 are all disposed within the housing 10. When the first surface 21 of the mother board 20 approaches the housing 10, in which the mother board 20, the electromagnetic filter board 40, the signal board 50 and the first power device 23 are accommodated, with the first power device 23 on the second surface 22 being clamped in the accommodating space 33 between the first elastic clamp 32 and the first insulated heat-conducting sheet 31, the first power device 23 is pressed against by the first elastic clamp 32 at its first face 23a and is thus adhered to the first insulated heat-conducting sheet 31 at its second face 23b, so that the first power device 23 is thermally coupled to the first heat-dissipation wall 11 and the coolant passage 12 via the first insulated heat-conductive sheet 31. Therefore, the position where the first power device 23 is disposed on the mother board 20 is also adjustable according to the actual applications and needs. The present invention is not limited to the foregoing embodiments and the relevant details will not be repeated. In the above embodiment, the mother board 20 can be composed of one or more circuit boards.

Particularly, although, according to the actual application needs, the first heat-dissipation wall 11 of the invention can be disposed at any position on the housing 10 where it can be thermally coupled to the coolant passage 12, in this embodiment, it is preferably disposed adjacent to the peripheral side of the housing 10. Furthermore, the first power device 23 may be disposed to, for example but not limited to, stand upright on the mother board 20 and inserted on the first surface 21 of the mother board 20, and is preferably disposed adjacent to the peripheral side of the mother board 20. In another aspect, the first insulated heat-conducting sheet 31 can be pre-bonded to the corresponding first heat-dissipation wall 11 via, for example but not limited to, a thermal conductive adhesive (not shown) while the first elastic clamp 32 can be pre-fixed to the housing 10 by using, for example but not limited to, a bolt, so that a desired accommodating space 33 is formed between the first elastic clamp 32 and the first insulated heat-conducting sheet 31, so as to accommodate and clamp the first power device 23 later. In one embodiment, the first power device 23 can be bonded to the first insulated heat-conducting sheet 31 via, for example but not limited to, a thermal conductive adhesive (not shown).

It should be noted that, since the heat-dissipation module 30 is disposed on the peripheral side of the housing 10 corresponding to the first heat-dissipation wall 11 while the first power device 23 is disposed adjacent to the peripheral side of the mother board 20, the first elastic clamp 32 may be pre-fixed to the housing 10, or may be locked to the housing 10 by using for example but not limited to a bolt when the mother board 20 has been disposed upon the housing 10, so that the first power device 23 is pressed against by the first elastic clamp 32 at its first face 23a and is thus adhered to the first insulated heat-conducting sheet 31 at its second face 23b, so that the first power device 23 is accommodated and clamped in the accommodating space 33, and thermally coupled to the first heat-dissipation wall 11 and the coolant passage 12 via the first insulated heat-conducting sheet 31. In addition, the power conversion apparatus 1 further comprises an outer cover 60 disposed upon the housing 10 and the mother board 20, and covering the second surface 22 of the mother board 20 to protect the power conversion apparatus 1.

In another aspect, in this embodiment, the power conversion apparatus 1 is further constructed as a unidirectional power conversion apparatus to convert an AC power to a high voltage DC power. In addition to the electromagnetic filter board 40 and the signal board 50 that are electrically connected to the mother board 20 as mentioned above, the mother board 20 further comprises a transformer module 24 and at least one second power device 25 to construct the power conversion apparatus 1 as a unidirectional power conversion apparatus. The transformer module 24 and the second power device 25 are disposed on the first surface 21 of the mother board 20, with the second power device 25 flat-laying on the mother board 20.

In another aspect, in order to constructing the power conversion apparatus 1 to have both high power density and high heat-dissipation efficiency, the housing 10 further comprises a second heat-dissipation wall 15, a first accommodating groove 13, and a second accommodating groove 14, wherein the second heat-dissipation wall 15, the first accommodating groove 13 and the second accommodating groove 14 are thermally coupled to the cooling passage 12 like the aforementioned first heat-dissipation wall 11. The heat-dissipation module 30 further comprises at least one second insulated heat-conducting sheet 34 adhered to the corresponding second heat-dissipation wall 15, and at least one second elastic clamp 35 disposed between the first surface 21 of the mother board 20 and the first face 25a of the second power device 25. When the mother board 20 is disposed upon the housing 10, the second face 23b of the first power device 23 and the second face 25b of the second power device 25 are respectively thermally coupled to the first and second heat-dissipation walls 11, 15 of the housing 10 via the first and second insulated heat-conducting sheets 31, 34 of the heat-dissipation module 30 respectively.

In addition, in this embodiment, the transformer module 24 is further accommodated in the first accommodating groove 13, while the electromagnetic filter board 40 and the signal board 50 are accommodated in the second accommodating groove 14. Because the first accommodating groove 13 and the second accommodating groove 14 are thermally coupled to the coolant passage 12, the heat generated by the transformer module 24 and the electromagnetic filter board 40 can be transmitted to the coolant passage 12 via the first accommodating groove 13 and the second accommodating groove 14 and thus dissipate.

In one embodiment, when the transformer module 24 is accommodated in the first accommodating groove 13 while the electromagnetic filter board 40 and the signal board 50 are accommodated in the second accommodating groove 14, for example but not limited to, an insulated thermal conductive adhesive (not shown) can be added into the first accommodating groove 13 and the second accommodating groove 14, so as to increase the efficiency of the transformer module 24 and the electromagnetic filter board 40 for thermally coupling to the coolant passage 12 via the first accommodating groove 13 and the second accommodating groove 14, respectively. In this embodiment, the second accommodating groove 14 is disposed surrounding and adjacent to three sidewalls of the first accommodating groove 13. The first heat-dissipation wall 11 is disposed at the peripheral side of the housing 10 and adjacent to a sidewall of the first accommodating groove 13 or a sidewall of the second accommodating groove 14. The second heat-dissipation wall 15 is disposed on a top surface of a sidewall of the first accommodating groove 13 that is opposite to the sidewall of the first accommodating groove 13 to which the first heat-dissipation wall 11 is adjacent. When the first surface 21 of the mother board 20 faces the housing 10 and is disposed upon the housing 10, the first power device 23 of the power conversion apparatus 1 is thermally coupled to the first heat-dissipation wall 11 via the first insulated heat-conducting sheet 31, the transformer module 24 being accommodated and thermally coupled to the first accommodating groove 13, and the second power device 25 being thermally coupled to the second heat-dissipation wall 15 via the second insulated heat-conducting sheet 34. The first power device 23 and the second power device 25 can be respectively constructed as combination of a secondary-side power device and a primary-side power device.

Since the first heat-dissipation wall 11 and the second heat-dissipation wall 15, to which the first power device 23 and the second power device 25 respectively correspond, are disposed respectively adjacent to two opposite sidewalls of the first accommodating groove 13, the first power device 23 and the second power device 25 can be disposed adjacent to the place where the transformer module 24 is located, so that the power conversion apparatus 1 is constructed as a unidirectional power conversion apparatus with a high power density. In addition, the electromagnetic filter board 40 and the signal board 50 electrically connected to the mother board 20 are further accommodated in the second accommodating groove 14. Thereby, the first power device 23, the second power device 25, the transformer module 24, the electromagnetic filter board 40, and the signal board 50 can be simply and reliably assembled and fixed between the housing 10 and the mother board 20, enhancing the heat-dissipation capability of the first power device 23, the second power device 25, the transformer module 24, and the electromagnetic filter board 40, while reducing the overall volume of the power conversion apparatus 1 and increasing the overall power density of the power conversion apparatus.

In this embodiment, the coolant passage 12 of the housing 10 is further formed at faces opposite to the faces where the first heat-dissipation wall 11, the second heat-dissipation wall 15, the first accommodation groove 13, and the second accommodation groove 14 are located. The coolant passage 12 may include, for example, at least one channel 12c, 12d, 12f and at least one narrow face 12b, 12e, and is configured to cover a bottom cover 19. The bottom cover 19 may be locked to the housing 10 via, for example but not limited to, a bolt so as to form the coolant passage 12. The housing 10 further comprises a liquid inlet pipe 12a and a liquid outlet pipe 12g, the liquid inlet pipe 12a and the liquid outlet pipe 12g being connected with each other through the coolant passage 12.

Figure 4:
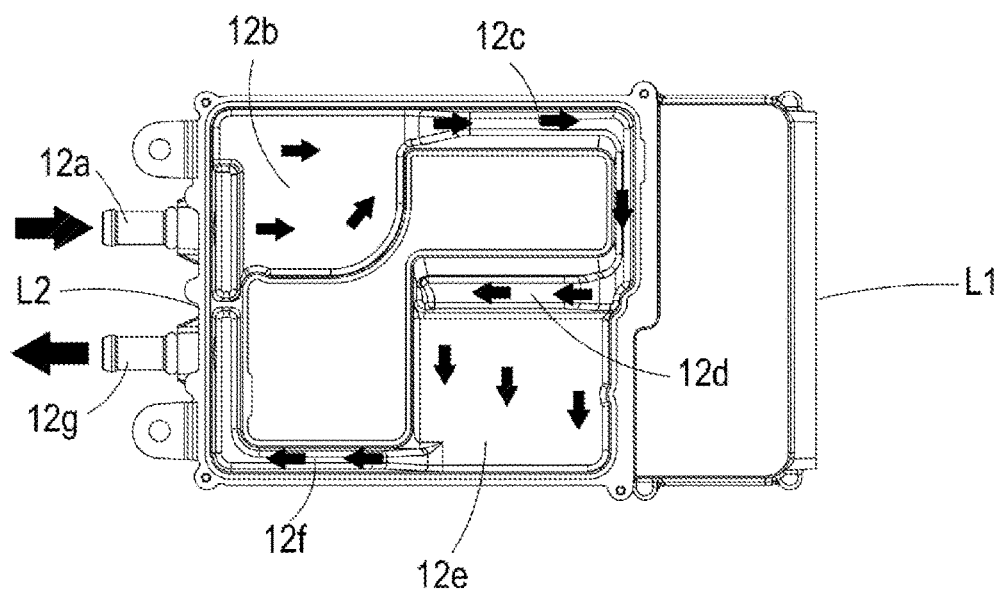
FIG. 4 is a configuration diagram of a coolant passage according to the first preferred embodiment of the present invention.

FIG. 4 is a diagram showing the configuration of a coolant passage in the first preferred embodiment of the present invention. As shown in FIG. 2, FIG. 3 and FIG. 4, in this embodiment, the coolant passage 12 includes, for example, three channels 12c, 12d, 12f and two narrow faces 12b, 12e. The channels 12c, 12f are thermally coupled to the first heat-dissipation wall 11, while the channel 12d is thermally coupled to the second heat-dissipation wall 15. Also, the channels 12c and 12d are thermally coupled to two opposite sidewalls of the first accommodating groove 13. Also, the narrow face 12b and the narrow face 12e are thermally coupled to the first accommodating groove 13 and the second accommodating groove 14, respectively. The liquid inlet pipe 12a is connected with the liquid outlet pipe 12g through the narrow face 12b, the channel 12c, the channel 12d, the narrow face 12e, and the channel 12f of the coolant passage 12. Thereby, the cooling passage 12 can efficiently take away the heat generated by the first power device 23 thermally coupled to the first heat-dissipation 11 via the first insulated heat-conducting sheet 31, the second power device 25 thermally coupled to the second heat-dissipation wall 15 via the second insulated heat-conducting sheet 34, the transformer module 24 thermally coupled to the first accommodating groove 13, and the electromagnetic filter board 40 thermally coupled to the second accommodating groove 14, thereby improving the heat-dissipation capability of the power conversion apparatus.

Of course, the arrangement of the cooling passage 12 of the housing 10 relative to the first heat-dissipation wall 11, the second heat-dissipation wall 15, the first accommodating groove 13 and the second accommodating groove 14 can be adjusted according to actual needs. The present invention is not limited to this embodiment, and the relevant details will not be repeated. Additionally, it should be noted that, in other embodiments, the first power device 23 can be an integrated power module, the second power device 25 can also be an integrated power module, so that the assembly structure of the power conversion apparatus 1 is simplified and the costs are reduced.

Figure 5:
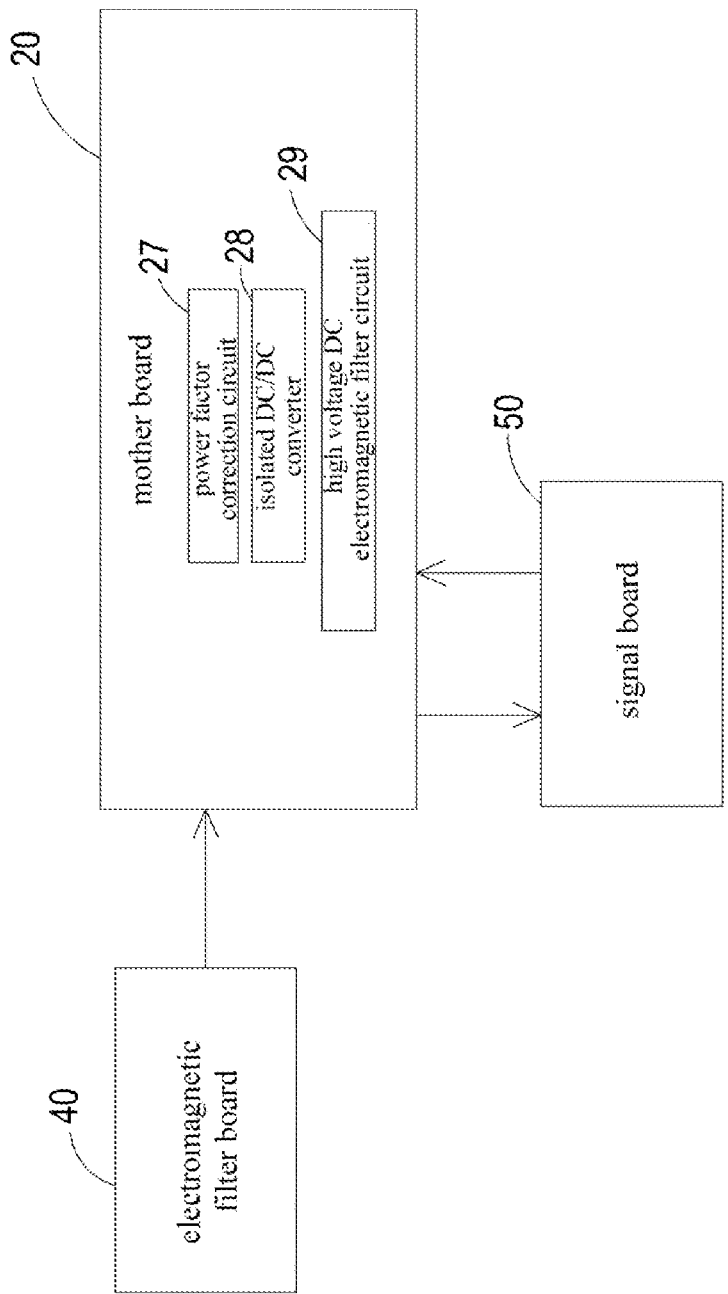
FIG. 5 is a circuit block diagram illustrating the power conversion apparatus according to the first preferred embodiment of the present invention.

It should be noted that, in this embodiment, when the power conversion apparatus 1 is constructed as a unidirectional power conversion apparatus for converting an AC power to a high voltage DC power, the assembly structure of the power conversion apparatus 1 further comprises a power input terminal 16, a power output terminal 17, and a signal transmission terminal 18, which can be disposed on for example a first side L1 of the housing 10, opposite to a second side L2 where the liquid input pipe 12a and the liquid output pipe 12g are disposed on. FIG. 5 is a circuit block diagram illustrating a power conversion apparatus according to the first preferred embodiment of the present invention. To realize the unidirectional power conversion apparatus, the first power device 23, the second power device 25 and the transformer module 24 on the mother board 20 are further assembled and constructed with other electronic components into, for example, a power factor correction circuit 27, an isolated DC/DC converter 28, and a high voltage DC electromagnetic filter circuit 29. The electromagnetic filter board 40 electrically connected to the mother board 20 may be constructed as, for example, an AC electromagnetic filter board. In addition, the signal board 50 electrically connected to the mother board 20 may be constructed as, for example, a low voltage signal board.

Referring to FIG. 3 and FIG. 5, when the power conversion apparatus performs power conversion, an input AC power may be transmitted via the power input terminal 16 to the AC electromagnetic filter board constructed by the electromagnetic filter board 40, and then transmitted to the power factor correction circuit 27 of the mother board 20, converted to a high voltage DC power by the mother board 20, and then output via the power output terminal 17. On the other hand, when the power conversion apparatus performs signal processing, the input signal is transmitted via the signal transmission terminal 18 to the low voltage signal board constructed by the signal board 50, traveling through the primary side and the secondary side constructed by the first power device 23 and the second power device 25 on the mother board 20, and then output via the signal board 50 and the signal transmission terminal 18.

It should be noted that, in this embodiment, further due to the demands of performing the power conversion and the signal processing as above described, the electromagnetic filter board 40 and the signal board 50 accommodated in the second accommodating groove 14 of the housing 10 are disposed adjacent to the first side L1 where the power input terminal 16 and the signal transmission terminal 18 are located on, so as to reduce the distance between the power input terminal 16 and the electromagnetic filter board 40 and the distance between the signal transmission terminal 18 and the signal board 50, thereby improving the power efficiency of the power conversion apparatus 1. Of course, the arrangement of the power input terminal 16, the power output terminal 17 and the signal transmission terminal 18 with respect to the electromagnetic filter board 40 and the signal board 50 can be adjusted according to actual needs. The present disclosure is not limited to the foregoing embodiment.

Figure 6:
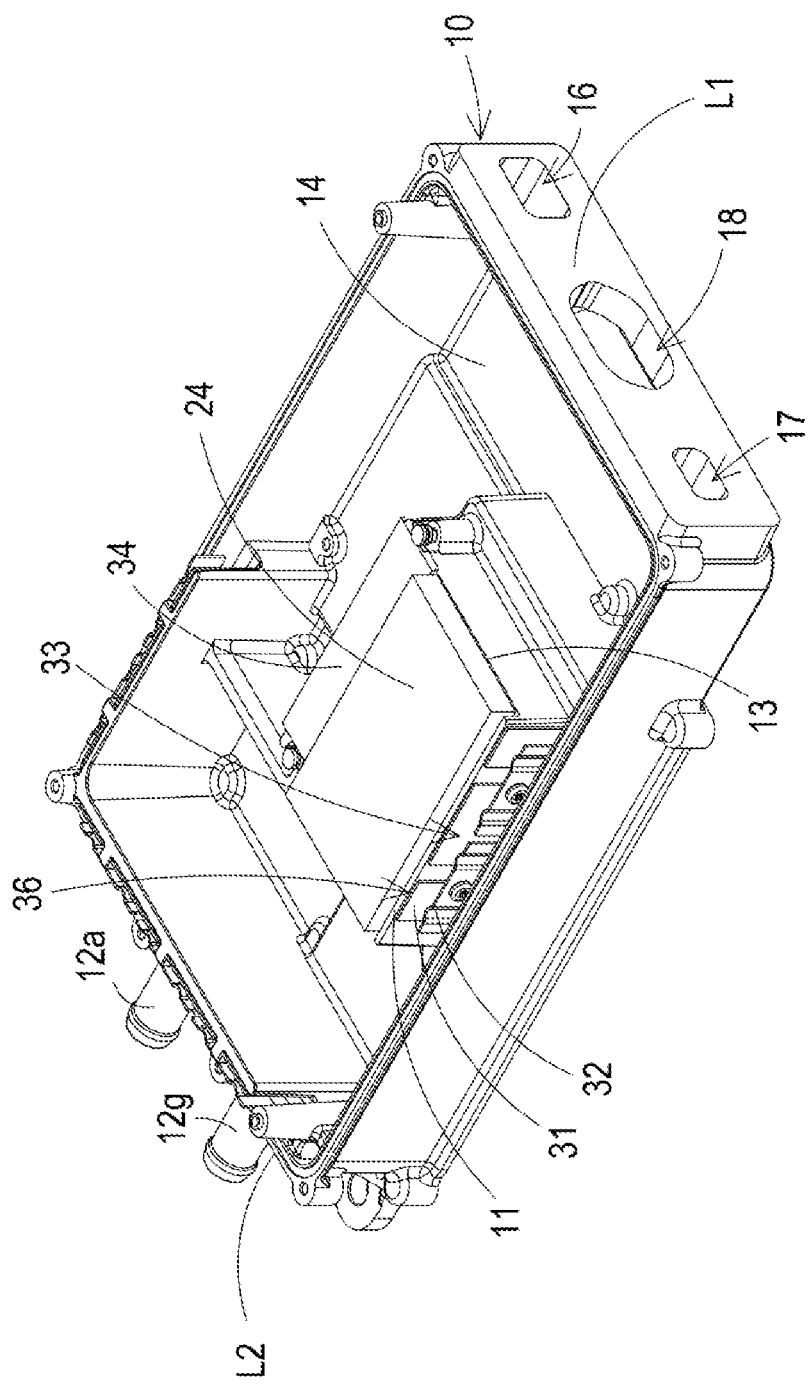
FIGS. 6 to 9 are schematic views illustrating the structure of the power conversion apparatus at different stages of assembly according to the first preferred embodiment of the present invention.

Particularly, the arrangement of the individual components of the power conversion apparatus 1 can be optimized to realize a unidirectional power conversion, making their assembly and fixation simple and reliable, enhancing the heat-dissipation capability of the individual components, and reducing the overall volume of the power conversion apparatus and increasing the overall power density of the power conversion apparatus. FIGS. 6 to 9 are schematic views illustrating the structure of the power conversion apparatus at different stages of assembly according to the first preferred embodiment of the present invention. Firstly, as shown in FIG. 6, in this embodiment, the housing 10 includes at least one first heat-dissipation wall 11, a coolant passage 12 (FIG. 2), a first accommodating groove 13, a second accommodating groove 14, a second heat-dissipation wall 15 (FIG. 1), a power input terminal 16, a power output terminal 17, a signal transmission terminal 18, a liquid inlet pipe 12a, and a liquid outlet pipe 12g.

The power input terminal 16, the power output terminal 17 and the signal transmission terminal 18 are disposed on the first side L1 of the housing 10. The liquid inlet pipe 12a and the liquid outlet pipe 12g are disposed on the second side L2 opposite to the first side L1. The coolant passage 12 is disposed on an opposite bottom surface relative to the first heat-dissipation wall 11, the first accommodating groove 13, the second accommodating groove 14, and the second heat-dissipation wall 15, so as to thermally couple to the first heat-dissipation wall 11, the first accommodating groove 13, the second accommodating groove 14, and the second heat-dissipation wall 15. The first insulated heat-conducting sheet 31 and the second insulated heat-conducting sheet 34 of the heat-dissipation module 30 may be, for example but not limited to, a Direct-Bond-Copper (DBC) ceramic substrate, and are pre-bonded to the first heat-dissipation wall 11 and the second heat-dissipation wall 15, respectively, via, for example but not limited to, a thermal conductive adhesive 36.

In this embodiment, the first elastic clamp 32 of the heat-dissipation module 30 is pre-fixed to the housing 10 by using for example but not limited to a bolt, so that a desired accommodating space 33 is formed between the first elastic clamp 32 and the first insulated heat-conducting sheet 31 for accommodating and clamping the first power device 23 later. However, the order in which the first elastic clamp 32 is fixed to the housing 10 is not an essential technical feature limiting the present invention. In one embodiment, the first elastic clamp 32 can be locked to the housing 10 after the second face 23b of the first power device 23 being disposed adjacent to the first insulated heat-conducting sheet 31, so that the first power device 23 is pressed against by the first elastic clamp 32 at its first face 23a and is thus adhered to the first insulated heat-conducting sheet 31 at its second face 23b, so that the first power device 23 is accommodated and clamped in the accommodating space 33 and thermally coupled to the first heat-dissipation wall 11 and the coolant passage 12 via the first insulated heat-conducting sheet 31. In the other aspect, the transformer module 24 electrically connected to the mother board 20 may also be accommodated in the first accommodating groove 13 in advance. In such embodiment, when the transformer module 24 is accommodated in the first accommodating groove 13, the first accommodating groove 13 can be filled with for example but not limited to a thermal conductive adhesive (not shown), so as to enhance the efficiency of thermally coupling the transformer module 24 to the cooling passage 12 via the first accommodating groove 13.

Figure 7:
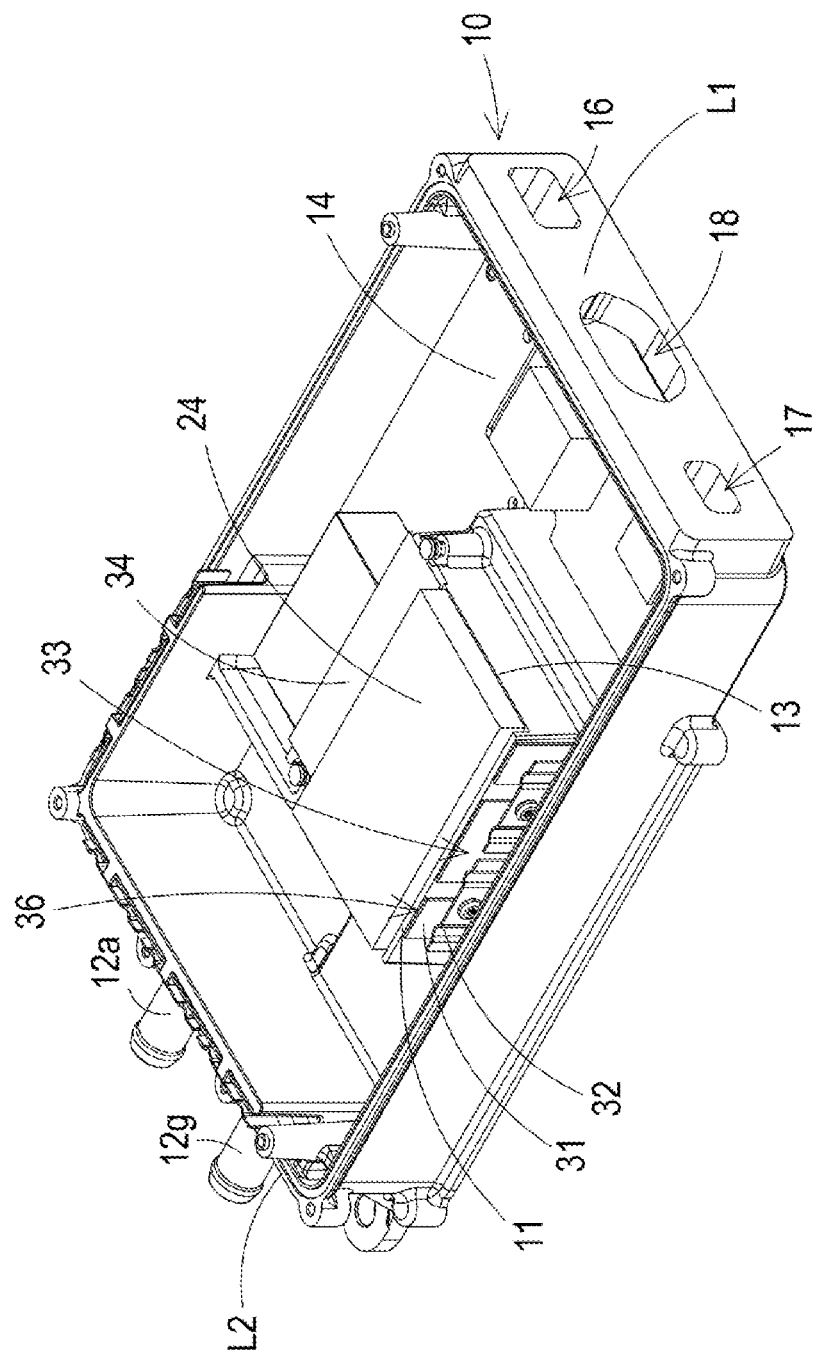

Next, as shown in FIG. 7, the electromagnetic filter board 40 and the signal board 50 connected to the mother board 20 may also be accommodated in the second accommodating groove 14 in advance. Likewise, in this embodiment, when the electromagnetic filter board 40 and the signal board 50 are accommodated in the second accommodating groove 14, the second accommodating groove 14 can be filled with, for example but not limited to, a thermal conductive adhesive (not shown), so as to enhance the efficiency of thermally coupling the electromagnetic filter board 40 and the signal board 50 to the cooling passage 12 via the second accommodating groove 14. It should be noted that, since the power conversion apparatus 1 of the present invention may be configured as, for example, a unidirectional power conversion apparatus, for the demands of performing the power conversion and the signal processing as previously described, when the electromagnetic filter board 40 and the signal board 50 are accommodated in the second accommodating groove 14, said electromagnetic filter board 40 and said signal board 50 can be disposed respectively adjacent to the first side L1 where the power input terminal 16 and the signal transmission terminal 18 are located on, respectively, so as to reduce the distance between the power input terminal 16 and the electromagnetic filter board 40 and the distance between the signal transmission terminal 18 and the signal board 50, thereby improving the power efficiency of the power conversion apparatus 1.

Figure 8:
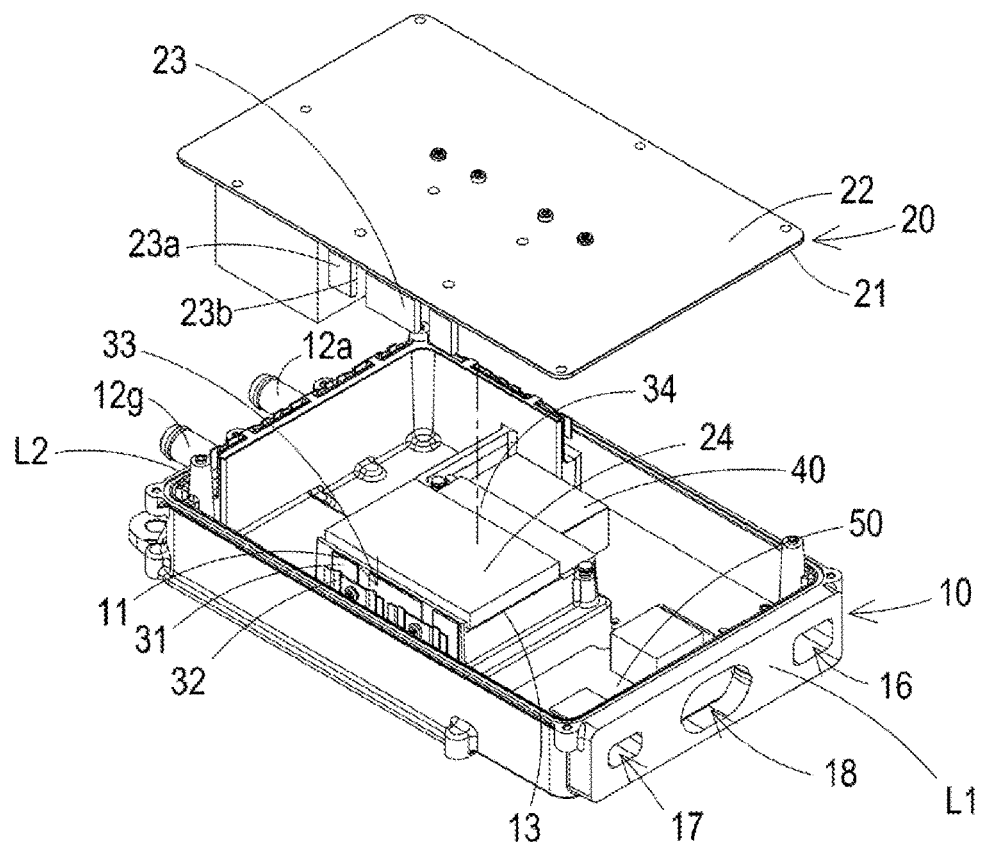
Figure 9:
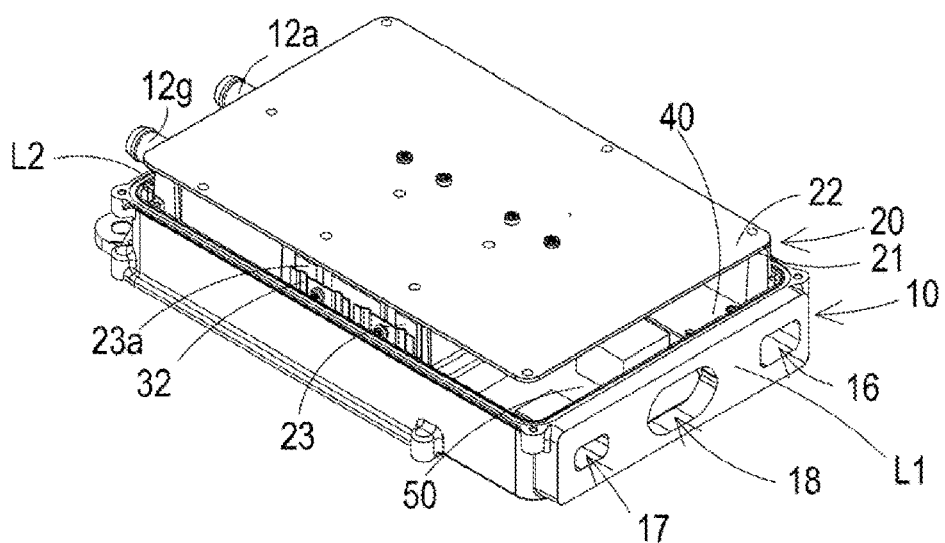

Then, as shown in FIG. 8, when the first surface 21 of the mother board 20 approaches the housing 10, the first power device 23 and the second power device 25 on the mother board 20 correspond to the first heat-dissipation wall 11 and the second heat-dissipation wall 15, respectively, while the mother board 20 is locked to the housing 10 by, for example but not limited to, a bolt. In this embodiment, for example, the second elastic clamp 35 (FIG. 2) of the heat-dissipation module 30 may be disposed between the first surface 21 of the mother board 20 and the first face 25a of the second power device 25. When the first surface 21 of the mother board 20 approaches the housing 10, the second power device 25 is pressed against by the second elastic clamp 35 at its first face 25a and is thus adhered to the second insulated heat-conducting sheet 34 at its second face 25b, so that the second power device 25 is thermally coupled to the second heat-dissipation wall 15 and the coolant passage 12 via the second insulated heat-conducting sheet 34. In addition, if the first elastic clamp 32 is pre-fixed to the housing 10 and forms the accommodating space 33 with the first insulated heat-conducting sheet 31, then when the first surface 21 of the main board 20 approaches the housing 10, the first power device 23 is inserted into the accommodating space 33, so that the first power device 23 is pressed against by the first elastic clamp 32 at its first face 23a and is thus adhered to the first insulated heat-conducting sheet 31 at its second face 23b, so that the first power device 23 is thermally coupled to the first heat-dissipation wall 11 and the coolant passage 12 via the first insulated heat-conducting sheet 31. The assembled power conversion apparatus 1 is shown in FIG. 9.

It should be noted that, in this embodiment, the first elastic clamp 32 of the heat-dissipation module 30 is disposed on the peripheral side of the housing 10 corresponding to the first heat-dissipation wall 11, while the first power device 23 is disposed adjacent to the peripheral side of the mother board 20. Thus, the first elastic clamp 32 may be locked to the housing 10 by using, for example but not limited to, a bolt after the mother board 20 being assembled and constructed upon the housing 10, so that the first power device 23 is pressed against by the first elastic clamp 32 at its first face 23a and is thus adhered to the first insulated heat-conducting sheet 31 at its second face 23b, so that the first power device 23 is thermally coupled to the first heat-dissipation wall 11 and the coolant passage 12 via the first insulated heat-conducting sheet 31. Of course, the first elastic clamp 32 also may be disposed on the peripheral side of the housing 10 in advance. The elastic force by which the first elastic clamp 32 presses against the first face 23a of the first power device 23 may be adjusted after the mother board 20 being constructed upon the housing 10. It should be noted that the pattern in which the first elastic clamp 32 presses against the first face 23a of the first power device 23 and the order of assembling the first elastic clamp 32 into the housing 10 is adjustable according to actual needs, which are not essential features that limit the technical solution of the present invention. Any elastic clamp that can form accommodating space 33 with respect to the first heat-dissipation wall 11 and maintain the elastic force is suitable for the assembly structure of the present invention, which is not limited to this embodiment. In this embodiment, the power conversion apparatus 1 may further include an outer cover 60 (FIG. 1), which is disposed upon the housing 10 and the mother board 20 and covers the second surface 22 of the mother board 20 to protect the power conversion apparatus 1.

Particularly, in this embodiment, when the power conversion apparatus 1 is construct as, for example, a unidirectional power conversion apparatus, the main heat generation components that unidirectionally convert an AC power to a high voltage DC power, such as the first power device 23, the second power device 25 and the transformer module 24 on the mother board 20 as well as the electromagnetic filter board 40 in this embodiment, are all thermally coupled to the coolant passage 12 of the housing 10 at the shortest distance. The first power device 23 and the second power device 25 that may generate a large amount of heat are further thermally coupled to the first heat-dissipation wall 11 and the second heat-dissipation wall 15 of the housing 10 via, for example, a Direct-Bond-Copper (DBC) ceramic substrate, so as to reduce interface thermal resistance. More preferably, the second face 23b of the first power device 23 and the first insulated heat-conducting sheet 31, the first insulated heat-conducting sheet 31 and the first heat-dissipation wall 11, the second face 25b of the second power device 25 and the second insulated heat-conducting sheet 34, and the second insulated heat-conducting sheet 34 and the second heat-dissipation wall 15 can be further adhered by a thermal interface material, such as but not limited to, a thermal conductive adhesive 36 (see FIG. 6), so as to further decrease the interface thermal resistance in the heat dissipation path. Furthermore, for example but not limited to, an insulated thermal conductive adhesive (not shown) can be filled into the first accommodating groove 13 and the second accommodating groove 14 accommodating the transformer module 24, the electromagnetic filter board 40, and the signal board 50, so as to enhance the efficiency of thermally coupling the transformer module 24 and the electromagnetic filter board 40 with the coolant passage 12.

It should be noted that, in addition that the power conversion apparatus 1 of the present invention is designed to allow the main heat generation components to be thermally coupled the coolant passage 12 at the shortest distance, the first heat-dissipation wall 11, the second heat-dissipation wall 15, the first accommodating groove 13, and the second accommodating groove 14 are positioned and arranged with consideration of the electrical connection relationship among the main components. For example, the first power device 23 and the second power device 25 in the embodiment are respectively configured as a secondary-side power device and a primary-side power device, which are necessary for performing the unidirectional power conversion. Since the first and second power devices 23, 25 respectively correspond to the first and second heat-dissipation walls 11, 15 while the first and second heat-dissipation walls 11, 15 are respectively disposed adjacent to two opposite sidewalls of the first accommodating groove 13, the first and second power devices 23, 25 can be disposed adjacent to a place where the transformer module 24 is located on, so as to reduce the respective conduction distances from the respective secondary-side and primary-side power devices to the transformer, facilitating the reduction of conduction resistances and the avoiding of interference, and improving the efficiency.

Likewise, in order to satisfy the need of the power conversion apparatus 1 to perform unidirectional power conversion and signal processing, the electromagnetic filter board 40 and the signal board 50 are disposed adjacent to the first side L1 where the power input terminal 16 and the signal transmission terminal 18 are located, so as to reduce the conduction distance between the power input terminal 16 and the electromagnetic filter board 40 and the conduction distance between the signal transmission terminal 18 and the signal board 50, and also improve the efficiency of the power conversion apparatus 1. Furthermore, the liquid inlet pipe 12a and the liquid outlet pipe 12g communicating with the coolant passage 12 may be disposed on the second side L2 opposite to the first side L1, so that the space of the power conversion apparatus 1 can be fully and integratedly used and the overall volume of the power conversion apparatus 1 can be reduced, achieving the purpose of increasing both power density and heat-dissipation efficiency. However, it should be noted that, the optimization of the arrangement of the individual components between the housing 10 and the mother board 20 in the power conversion apparatus 1 described above can be adjusted and changed according to actual needs. The present invention is not limited to the combinations of the foregoing exemplified embodiments, and details will not be repeated here.

The above embodiments are described with the power conversion apparatus 1 configured as a unidirectional power conversion apparatus as an example. In other embodiments, the power conversion apparatus 1 may also be configured as a bidirectional power conversion apparatus for performing bidirectional conversions between an AC power and a high voltage DC power.

In summary, the present invention provides an assembly structure of a power conversion apparatus. By optimizing the arrangement of individual components, the assembly and fixing of the power conversion apparatus is simple and reliable, the heat-dissipation capability of the respective components being enhanced, the overall volume of the power conversion apparatus being reduced, and the overall power density of the power conversion apparatus being increased. Moreover, the power devices on the mother board are fixed and adhered to the heat-dissipation surfaces of the housing via the heat-dissipation module that is insulated heat-conducting, while the respective components are disposed between the mother board and the housing and accommodated in the accommodating grooves of the housing, and both the heat-dissipation surfaces and the accommodating grooves of the housing being thermally coupled to the coolant passage of the housing, so as to reduce the interface thermal resistance and simplify the assembly structure, thus achieving the purpose of reducing the costs and improving the reliability and heat-dissipation capability of the assembled structure.

Various modifications of the present invention may be made by those skilled in the art without departing from the scope of the attached claims.

What is claimed is:
1. A power conversion apparatus, comprising
a housing comprising
    a coolant passage; and
    at least one first heat-dissipation wall thermally coupled to the coolant passage;
a mother board disposed upon the housing and comprising
    a first surface facing the housing;
    at least one first power device disposed on the mother board and comprising a first face and a second face; and
    at least one second power device disposed on the first surface of the mother board and including a first face and a second face;
an electromagnetic filter board disposed upon the housing and electrically connected to the mother board;
a signal board disposed upon the housing and electrically connected to the mother board; and
a heat-dissipation module comprising
    at least one first insulated heat-conducting sheet, adhered to the corresponding at least one first heat-dissipation wall;
    at least one first elastic clamp, fixed to the housing and opposite to the at least one first insulated heat-conducting sheet, so that an accommodating space is defined by the at least one first elastic clamp and the at least one first insulated heat-conducting sheet, wherein when the first surface of the mother board approaches the housing and to clamp the at least one first power device in the accommodating space between the at least one first elastic clamp and the at least one first insulated heat-conducting sheet, the at least one first power device is pressed against by the at least one first elastic clamp at the first face and thus adhered to the at least one first insulated heat-conducting sheet at the second face, so that the at least one first power device is thermally coupled to the at least one first heat-dissipation wall and the coolant passage via the at least one first insulated heat-conducting sheet,
    at least one second insulated heat-conducting sheet; and
    at least one second elastic clamp, disposed between the first surface of the mother board and the first face of the at least one second power device and opposite to the at least one second insulated heat-conducting sheet.

2. The power conversion apparatus according to claim 1, wherein the at least one first power device is disposed on the first surface of the mother board, and wherein both the electromagnetic filter board and the signal board are disposed between the first surface of the mother board and the housing.

3. The power conversion apparatus according to claim 1, wherein the housing includes a first accommodating groove and a second accommodating groove, which are thermally coupled to the coolant passage, wherein the second accommodating groove is disposed to partly surround the first accommodating groove.

4. The power conversion apparatus according to claim 3, wherein the mother board further comprises a transformer module electrically connected to the mother board and disposed between the first surface of the mother board and the housing.

5. The power conversion apparatus according to claim 4, wherein the transformer module is accommodated in the first accommodating groove, while the electromagnetic filter board and the signal board are accommodated in the second accommodating groove.

6. The power conversion apparatus according to claim 3, wherein the at least one first heat-dissipation wall is disposed adjacent to a sidewall of the first accommodating groove or the second accommodating groove.

7. The power conversion apparatus according to claim 3, wherein the coolant passage includes at least one channel and at least one narrow face.

8. The power conversion apparatus according to claim 7, wherein the at least one channel is thermally coupled to the at least one first heat-dissipation wall, a sidewall of the first accommodating groove, or a sidewall of the second accommodating groove.

9. The power conversion apparatus according to claim 7, wherein the at least one narrow face is thermally coupled to a bottom surface of the first accommodating groove or a bottom surface of the second accommodating groove.

10. The power conversion apparatus according to claim 1, wherein the housing further comprises at least one second heat-dissipation wall facing the first surface of the mother board and thermally coupled to the coolant passage, the at least one second insulated heat-conducting sheet being adhered to the corresponding at least one second heat-dissipation wall, and wherein when the first surface of the mother board approaches the housing, the at least one second power device is pressed against by the at least one second elastic clamp at the first face thereof and thus adhered to the at least one second insulated heat-conducting sheet at the second face thereof, so that the at least one second power device is thermally coupled to the at least one second heat-dissipation wall and the coolant passage via the at least one second insulated heat-conducting sheet.

11. The power conversion apparatus according to claim 10, wherein the housing includes a first accommodating groove, and wherein the at least one first heat-dissipation wall and the at least one second heat-dissipation wall opposite to the at least one first heat-dissipation wall are disposed adjacent to two opposite sidewalls of the first accommodating groove, respectively.

12. The power conversion apparatus according to claim 10, wherein the at least one second power device is disposed to flat-lay on the mother board.

13. The power conversion apparatus according to claim 10, wherein the at least one second power device is an integrated power module.

14. The power conversion apparatus according to claim 1, wherein the at least one first power device is disposed to stand upright on the mother board.

15. The power conversion apparatus according to claim 1, further comprising a power input terminal, a power output terminal, and a signal transmission terminal, which are disposed on a first side of the housing, the power input terminal being electrically connected to the mother board via the electromagnetic filter board, the power output terminal being electrically connected to the mother board, and the signal transmission terminal being electrically connected to the mother board via the signal board.

16. The power conversion apparatus according to claim 15, wherein the signal board is disposed adjacent to the first side of the housing.

17. The power conversion apparatus according to claim 15, wherein the housing comprises a liquid inlet pipe and a liquid outlet pipe, wherein the liquid inlet pipe and the liquid outlet pipe communicate with each other through the coolant passage and are disposed on a second side of the housing opposite to the first side of the housing.

18. The power conversion apparatus according to claim 1, wherein the at least one first power device is disposed adjacent to a peripheral side of the mother board.

19. The power conversion apparatus according to claim 1, wherein the at least one first insulated heat-conducting sheet is a Direct-Bond-Copper ceramic substrate.

20. The power conversion apparatus according to claim 1, wherein the heat-dissipation module further comprises a thermal conductive adhesive disposed between the at least one first insulated heat-conducting sheet and the at least one first heat-dissipation wall.

21. The power conversion apparatus according to claim 1, wherein the at least one first power device is an integrated power module.

* * * * *